(12) United States Patent
Tiwari et al.

(10) Patent No.: US 11,984,506 B2
(45) Date of Patent: May 14, 2024

(54) FIELD EFFECT TRANSISTOR HAVING A GATE DIELECTRIC WITH A DIPOLE LAYER AND HAVING A GATE STRESSOR LAYER

(71) Applicant: Intel Corporation, Santa Clara, CA (US)

(72) Inventors: Vishal Tiwari, Hillsboro, OR (US); Rishabh Mehandru, Portland, OR (US); Dan S. Lavric, Beaverton, OR (US); Michal Mleczko, Portland, OR (US); Szuya S. Liao, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/912,103

(22) Filed: Jun. 25, 2020

(65) Prior Publication Data

US 2021/0408282 A1    Dec. 30, 2021

(51) Int. Cl.
*H01L 29/78* (2006.01)
*H01L 21/28* (2006.01)
(Continued)

(52) U.S. Cl.
CPC .... *H01L 29/7843* (2013.01); *H01L 21/28176* (2013.01); *H01L 29/401* (2013.01);
(Continued)

(58) Field of Classification Search
CPC . H01L 29/7845; H01L 29/513; H01L 29/517; H01L 21/022
See application file for complete search history.

(56) References Cited

U.S. PATENT DOCUMENTS

| | | | | |
|---|---|---|---|---|
| 2003/0236001 A1* | 12/2003 | Shinriki | ............. | H01L 21/0214 438/785 |
| 2006/0054937 A1* | 3/2006 | Lucovsky | ........... | H01L 29/7787 257/E29.253 |

(Continued)

FOREIGN PATENT DOCUMENTS

| | | | | |
|---|---|---|---|---|
| AU | 2012333237 B2 * | 12/2015 | ............ | H04W 24/02 |
| CN | 107958840 A * | 4/2018 | ............. | C23C 16/44 |

(Continued)

OTHER PUBLICATIONS

Lammers, "Witnessing Paradigm shift in semiconductor technology", Semiconductor International, Mar. 10, 2010 (Year: 2010).*

(Continued)

*Primary Examiner* — Joseph C. Nicely
(74) *Attorney, Agent, or Firm* — Schwabe, Williamson & Wyatt, P.C.

(57) ABSTRACT

Field effect transistors having field effect transistors having gate dielectrics with dipole layers and having gate stressor layers, and methods of fabricating field effect transistors having gate dielectrics with dipole layers and having gate stressor layers, are described. In an example, an integrated circuit structure includes a semiconductor channel structure including a monocrystalline material. A gate dielectric is over the semiconductor channel structure, the gate dielectric including a high-k dielectric layer on a dipole material layer, and the dipole material layer distinct from the high-k dielectric layer. A gate electrode has a workfunction layer on the high-k dielectric layer, the workfunction layer including a metal. A first source or drain structure is at a first side of the gate electrode. A second source or drain structure is at a second side of the gate electrode opposite the first side.

13 Claims, 12 Drawing Sheets

(51) Int. Cl.
  *H01L 29/40* (2006.01)
  *H01L 29/51* (2006.01)
  *H01L 29/06* (2006.01)
(52) U.S. Cl.
  CPC .......... *H01L 29/513* (2013.01); *H01L 29/517* (2013.01); *H01L 29/0653* (2013.01)

(56) References Cited

U.S. PATENT DOCUMENTS

| | | | |
|---|---|---|---|
| 2014/0252423 A1* | 9/2014 | Tsao | H01L 29/518 257/288 |
| 2016/0086860 A1* | 3/2016 | Kannan | H01L 29/78 438/592 |
| 2017/0243977 A1* | 8/2017 | Lin | H01L 29/42368 |
| 2019/0131418 A1* | 5/2019 | Ando | H01L 29/42372 |
| 2019/0157409 A1* | 5/2019 | Wang et al. | H01L 29/42364 |
| 2019/0378927 A1* | 12/2019 | Lin | H01L 29/66795 |
| 2021/0125832 A1* | 4/2021 | Bhatnagar | H01L 29/4966 |
| 2021/0305361 A1* | 9/2021 | Pranatharthi Haran | H01L 29/0673 |
| 2021/0376109 A1* | 12/2021 | Wang | H01L 29/513 |

FOREIGN PATENT DOCUMENTS

| | | | | |
|---|---|---|---|---|
| DE | 102019117656 A1 * | 4/2020 | | H01L 27/0924 |
| WO | WO-2011009361 A1 * | 1/2011 | | H01L 29/513 |

OTHER PUBLICATIONS

Reed et al, "Micro Mechanical Systems", Handbook of Sensors and Actuators, (Year: 1998).*

* cited by examiner

PLAN VIEW 1000

CROSS-SECTIONAL VIEWS

FIELD EFFECT TRANSISTOR HAVING A GATE DIELECTRIC WITH A DIPOLE LAYER AND HAVING A GATE STRESSOR LAYER

TECHNICAL FIELD

Embodiments of the disclosure are in the field of integrated circuit structures and, in particular, field effect transistors having gate dielectrics with dipole layers and having gate stressor layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
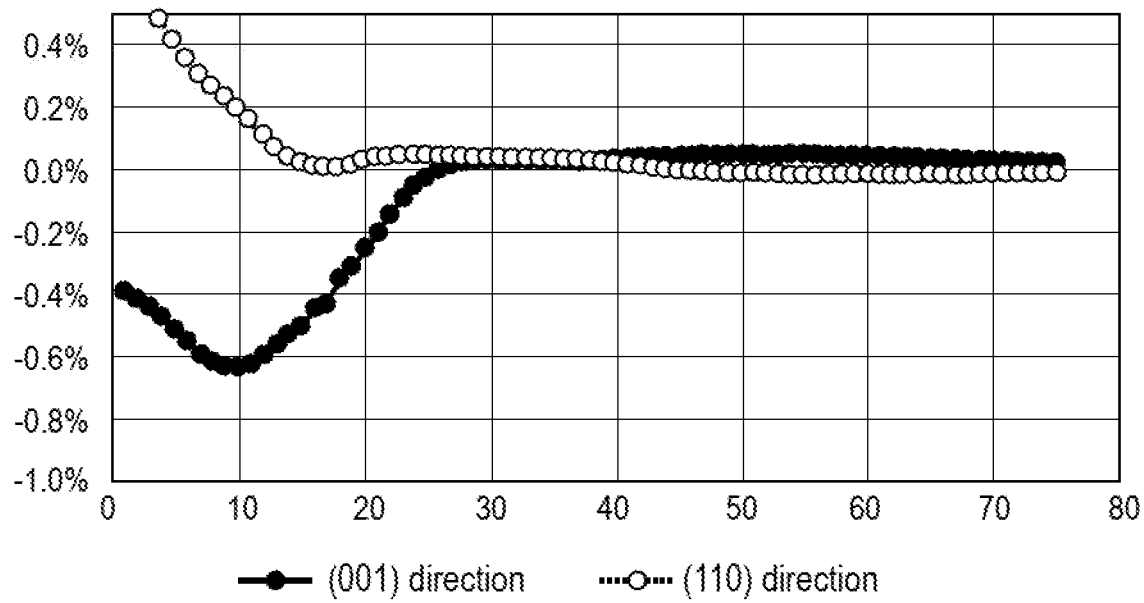
FIG. 1 is a plot of simulated strain profiles in the (001) direction and the (110) direction with a nano beam electron diffraction technique, in accordance with an embodiment of the present disclosure.

Field effect transistors having field effect transistors having gate dielectrics with dipole layers and having gate stressor layers, and methods of fabricating field effect transistors having gate dielectrics with dipole layers and having gate stressor layers, are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to approaches for setting a metal gate workfunction combined with a gate stressor for scaled performance at scaled process nodes. Embodiments may be directed to or include approaches for setting a metal gate workfunction and be implemented to address issues associated with lower channel stress from metal gate at scaled process nodes.

To provide context, previous solutions have employed thicker workfunction metals to set the threshold voltage and suffer from a lack of metal gate induced channel stress at scaled dimensions. Thicker workfunction metals are associated with less gate stressor volume, providing low or zero channel stress and impacting performance for aggressively scaled logic device dimensions. State-of-the-art logic transistors rely on improving drive current and performance by having higher channel stress. However, the stressor elements can become ineffective at sub-30 nm device pitches with less than 15 nm endcap because of less stressor volume.

In accordance with one or more embodiments of the present disclosure, dipoles are used to set the threshold voltage and to enable relative thinning of workfunction metal layers, allowing for increased gate stressor volume to increase the logic performance. Embodiments may be implemented to allow for a path to achieve metal gate-induced channel stress without affecting the electrostatics. In one embodiment, the threshold voltage (VT) is set by using a thin layer of dipole, thereby replacing thicker workfunction metals used in state-of-the-art scaled devices. Embodiments may provide a multi-VT solution and also provide ultra-low VT with a relatively thinner workfunction metal. Moreover, the ability to use a higher gate stressor volume can impart relatively more channel stress and improve transistor performance. The implementation of embodiments described herein may be detected in a final product by the usage of gate stressor in the gate stack using transmission electron microscopy and dipoles in energy dispersive X-ray microanalysis (EDX) maps or atom probe tomography. The effect of the gate stressor on channel strain can be detected using nanobeam electron diffraction technique in different orientations depending on the logic device architecture.

As an example, FIG. 1 is a plot 100 of simulated strain profiles in the (001) direction and the (110) direction with a nano beam electron diffraction technique, in accordance with an embodiment of the present disclosure. Referring to plot 100, a large vertical strain component is achieved with a gate stressor.

Figure 2A:
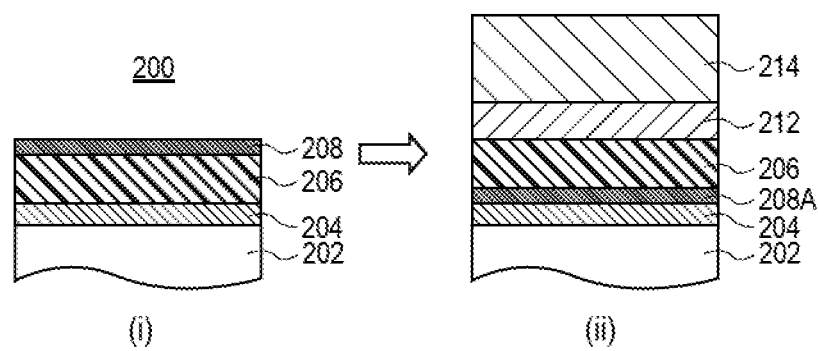
FIG. 2A illustrates cross-sectional views in a gate stack representing various operations in a method of fabricating a transistor with a gate stressor and a dipole layer used to tune the threshold voltage of the gate stack, in accordance with an embodiment of the present disclosure.

In an exemplary fabrication scheme, FIG. 2A illustrates cross-sectional views in a gate stack representing various operations in a method of fabricating a transistor with a gate stressor and a dipole layer used to tune the threshold voltage of the gate stack, in accordance with an embodiment of the present disclosure.

Referring to part (i) of FIG. 2A, a method of fabricating an integrated circuit structure includes forming a starting structure 200 including a high-k dielectric layer 206 above a semiconductor channel structure 202, such as on an amorphous silicon oxide layer 204 on the semiconductor channel structure 202. A material layer 208 is formed on the high-k dielectric layer 206.

Referring to part (ii) of FIG. 2A, a structure 210 is formed by first annealing the material layer 208 and the high-k dielectric layer 206 to form a gate dielectric over the semiconductor channel structure 202. The gate dielectric includes the high-k dielectric layer 206 on a dipole material layer 208A. The dipole material layer 208A is distinct from the high-k dielectric layer 206. Subsequent to annealing the material layer 208 and the high-k dielectric layer 206, a workfunction layer 212 is formed on the high-k dielectric layer, the workfunction layer 212 including a metal. In an embodiment, the method further includes forming a gate stressor layer 214 on the workfunction layer 212.

With reference again to FIG. 2A, a gate cross-section of a transistor at scaled device dimensions includes a thin layer of dipoles which may be oxides of group III transition or rare earth metals of the periodic table. The thin layer of dipole is responsible for setting the correct workfunction and hence the threshold voltage of the device. In one embodiment, the dipole layer is a group III metal oxide ($La_2O_3$, $Y_2O_3$, MgO, SrO, $Lu_2O_3$, etc. for NMOS, or $Al_2O_3$, $TiO_2$, $ZrO_2$, $HfO_2$ etc. for PMOS) at a thickness of approximately 1 to 3 Angstroms, and may be deposited by an atomic layer deposition technique.

Figure 2B:
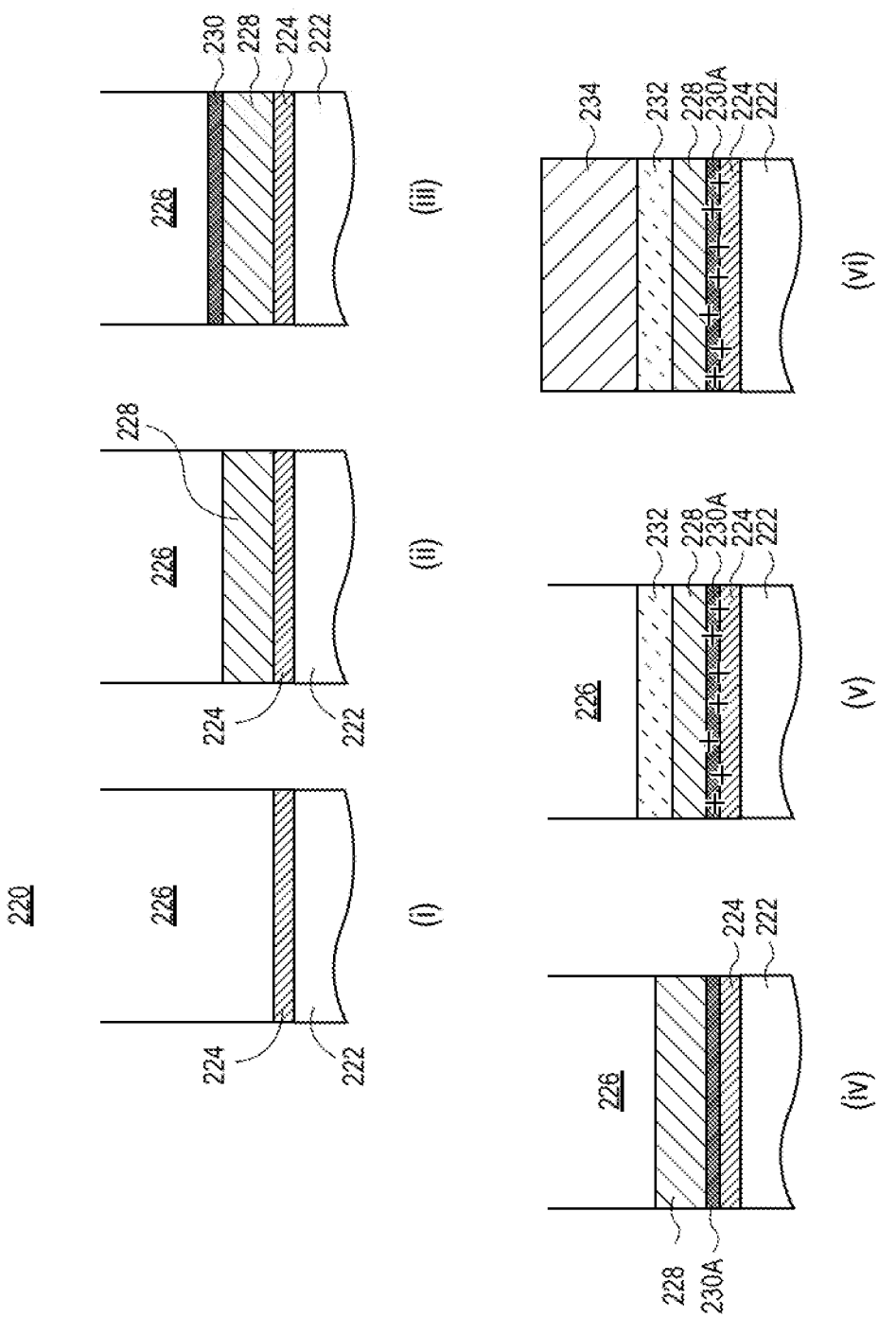
FIG. 2B illustrates cross-sectional views in a gate stack representing various operations in a method of fabricating a transistor with a gate stressor and a dipole layer used to tune the threshold voltage of the gate stack, in accordance with another embodiment of the present disclosure.

In another exemplary fabrication scheme, FIG. 2B illustrates cross-sectional views in a gate stack representing various operations in a method of fabricating a transistor with a gate stressor and a dipole layer used to tune the threshold voltage of the gate stack, in accordance with another embodiment of the present disclosure.

Referring to part (i) of FIG. 2B, a method of fabricating an integrated circuit structure includes forming a starting structure 220 including an amorphous oxide layer 224, such as an $SiO_2$ layer, on a semiconductor channel structure 222. A trench 226, such as a trench formed during a replacement gate scheme exposes the amorphous oxide layer 224.

Referring to part (ii) of FIG. 2B, a high-k dielectric layer 228 is formed in the trench 226 and on the amorphous oxide layer 224.

Referring to part (iii) of FIG. 2B, a material layer 230 is formed in the trench 226 and on the high-k dielectric layer 228.

Referring to part (iv) of FIG. 2B, the material layer 230 and the high-k dielectric layer 228 are annealed to form a gate dielectric over the semiconductor channel structure 222. The gate dielectric includes the high-k dielectric layer 228 on a dipole material layer 230A. The dipole material layer 230A is distinct from the high-k dielectric layer 228.

Referring to part (v) of FIG. 2B, a workfunction layer 232 is formed in the trench 226 and on the high-k dielectric layer 228. The workfunction layer 232 includes a metal.

Referring to part (vi) of FIG. 2B, a gate stack is formed by forming a gate stressor layer 234 on the workfunction layer 232.

With reference again to FIG. 2B, in accordance with an embodiment of the present disclosure, a high-k metal gate process is initiated after spacer formation and epitaxial deposition in front end flow. In the metal gate loop, a layer of chemical oxide 224 is formed during wet cleans. The layer can also or instead be thermally grown to improve the interface quality. A layer of high-k oxide 228 with higher dielectric constant is then deposited on the underlying chemical oxide layer 224. A dipole layer 230 is then deposited by an atomic layer deposition technique. The gate stack is then subjected to high anneal temperature during which the dipole 230 diffuses through the underlying high permittivity oxide layer 228 to form a net dipole 230A at the high-k 228/chemical oxide 224 interface. The process is understood as being effected due to the difference in the electronegativities of high-k and the chemical oxide layer. Subsequently, workfunction metals 232 are deposited, followed by a gate stressor 234 to increase channel stress.

With reference again to part (vi) of FIG. 2B, in accordance with an embodiment of the present disclosure, an integrated circuit structure includes a semiconductor channel structure 222 including a monocrystalline material. A gate dielectric is over the semiconductor channel structure 222. The gate dielectric includes a high-k dielectric layer 228 on a dipole material layer 230A. The dipole material layer 230A is distinct from the high-k dielectric layer 228. A gate electrode has a workfunction layer 232 on the high-k dielectric layer 228. The workfunction layer 232 includes a metal. As described in exemplary embodiments below, a first source or drain structure is at a first side of the gate electrode, and a second source or drain structure is at a second side of the gate electrode opposite the first side.

In an embodiment, the high-k dielectric layer 228 is an $HfO_2$ layer. In one such embodiment, the gate electrode is an N-type gate electrode, and the dipole layer 230A includes a material selected from the group consisting of $La_2O_3$, $Y_2O_3$, MgO, SrO and $Lu_2O_3$. In another such embodiment, the gate electrode is a P-type gate electrode, and the dipole layer 230A includes a material selected from the group consisting of $Al_2O_3$, $TiO_2$, $ZrO_2$ and $HfO_2$. In an embodiment, the dipole layer 230A has a thickness in the range of 1-3 Angstroms.

In an embodiment, the gate electrode further includes a gate stressor layer 234 on the workfunction layer 232. In one such embodiment, the gate electrode is an N-type gate electrode, and the gate stressor layer 234 includes a metal selected from the group consisting of W, Ti, Mn, Cr and Al. In another such embodiment, the gate electrode is a P-type gate electrode, and the gate stressor layer 234 includes a metal selected from the group consisting of Ti, Ta, Sn and Zr.

In an embodiment, the gate dielectric further includes an amorphous oxide layer 224 between the dipole material layer 230A and the semiconductor channel structure 222. In one such embodiment, the amorphous oxide layer 224 is an $SiO_2$ layer.

In accordance with an embodiment of the present disclosure, dipole layers of different thicknesses are used to tune the threshold voltage and thus provide a multi-threshold voltage solution for scaled logic transistors. Embodiments may be implemented to enable effectively thinning down a workfunction metal at the top layer to create more volume for the gate stressor. In one embodiment, the gate stressor is group VI metal of the periodic table or binary metallic alloys, such as tungsten W, Ti with Mn, Cr, Al for vertical compressive NMOS stress and Ti/Ta with Sn, Zr, etc. for PMOS stress.

Figure 3:
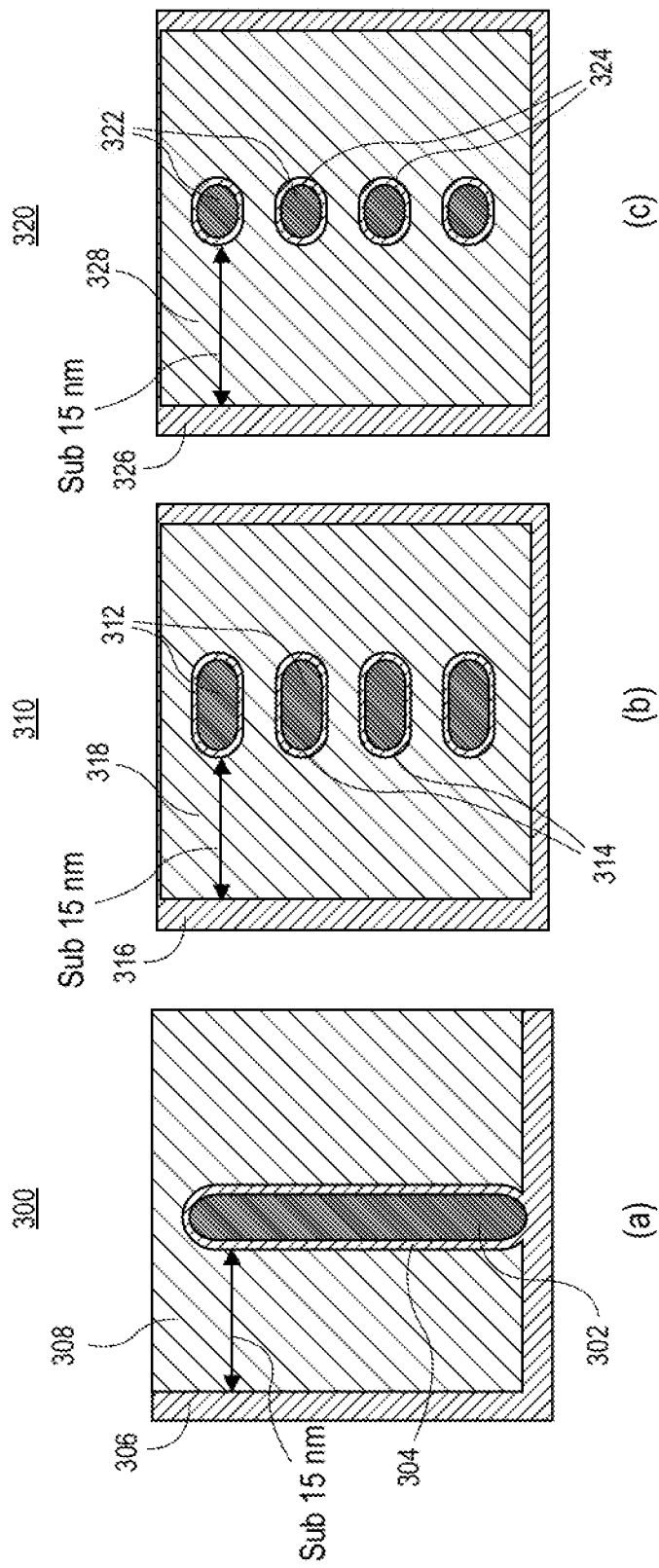
FIG. 3 illustrates cross-sectional schematics of various device architectures with sub 15 nm endcap, in accordance with an embodiment of the present disclosure.

In another aspect, a large vertical strain component is expected for (100) top oriented FinFET or (110) side oriented horizontal nanoribbons that can be validated using nano-beam electron diffraction simulation. PMOS transistor drive current is insensitive to vertical compressive stress from NMOS stressors and, therefore, the performance does not change. As an example, FIG. 3 illustrates cross-sectional schematics of various device architectures with sub 15 nm endcap, in accordance with an embodiment of the present disclosure. Referring to part (a) of FIG. 3, a (100) top oriented FinFET 300 with sub 15 nm endcap includes a fin 302, a gate dielectric 304, a dielectric endcap wall 306, and a gate electrode 308. Referring to part (b) of FIG. 3, a (110) side oriented nanoribbon structure 310 with sub 15 nm endcap includes nanoribbons 312, a gate dielectric 314, a dielectric endcap wall 316, and a gate electrode 318. Referring to part (c) of FIG. 3, a nanowire structure 320 with sub 15 nm endcap includes nanowires 322, a gate dielectric 324, a dielectric endcap wall 326, and a gate electrode 328.

Figure 4:
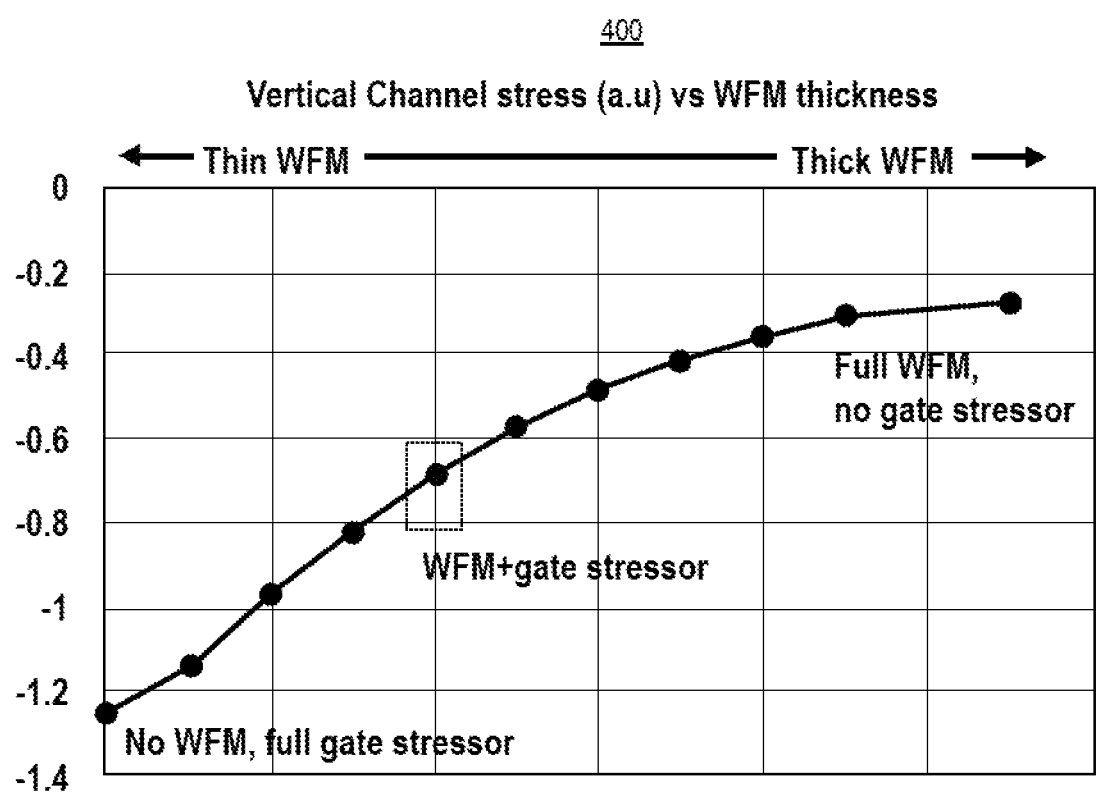
FIG. 4 is a plot highlighting simulation results showing the advantage of increase in vertical compressive stress with thinner workfunction metal and having more gate stressor on the top layer, in accordance with an embodiment of the present disclosure.

FIG. 4 is a plot 400 highlighting simulation results showing the advantage of increase in vertical compressive stress with thinner workfunction metal and having more gate stressor on the top layer, in accordance with an embodiment of the present disclosure. Referring to plot 400, simulation at advanced process node shows increase in channel stress with workfunction metal thickness and higher metal gate stress.

Figure 5:
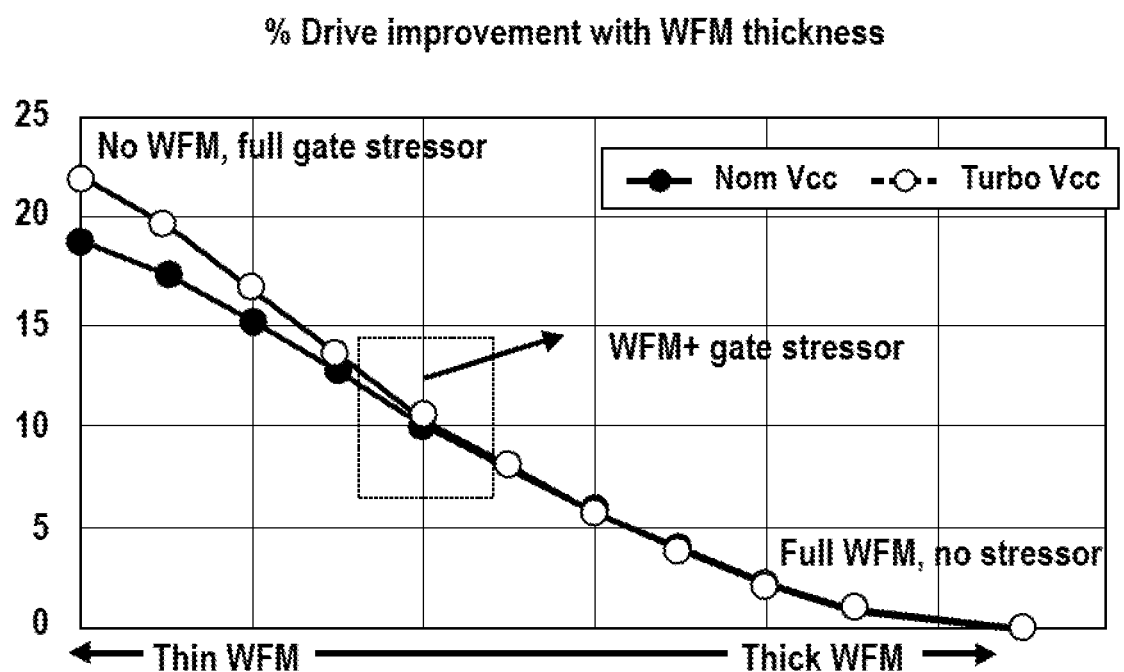
FIG. 5 is a plot showing how transistor drive can be improved with thinner workfunction metal and higher metal gate stress, in accordance with an embodiment of the present disclosure.

FIG. 5 is a plot 500 showing how transistor drive can be improved with thinner workfunction metal and higher metal gate stress, in accordance with an embodiment of the present disclosure. Referring to plot 500, embodiments of the present disclosure can be implemented to increase the drive current and performance of a transistor by 20%. Furthermore, multi-threshold voltage logic devices can be realized using different thicknesses of dipole layers (e.g., 1 to 3 Angstroms) to set the right workfunction for the gate stack. Referring again to plot 500, logic transistor simulation at advanced process node shows percentage drive (performance) improvement with workfunction metal thickness. Thinner workfunction metals allow more gate stressor volume for performance improvement.

Figure 6A:
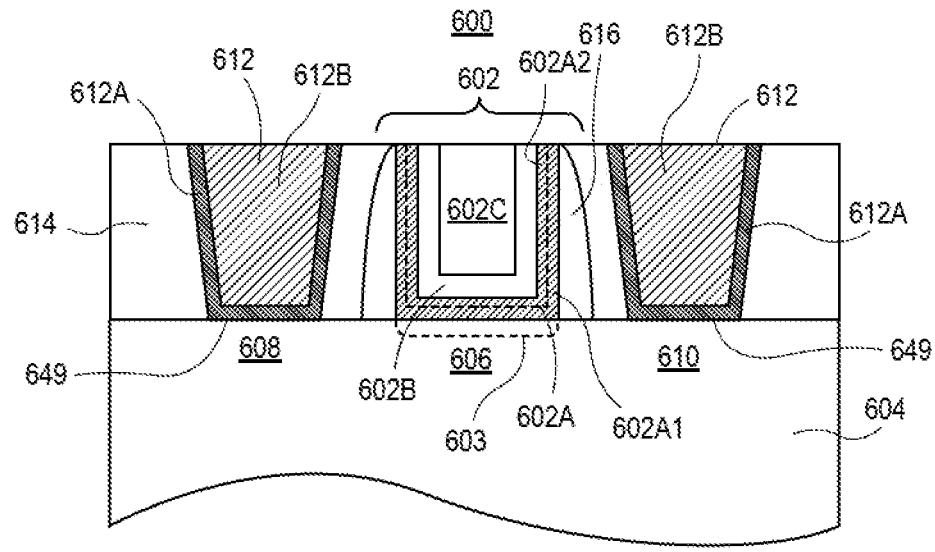
FIG. 6A illustrates a cross-sectional view of a semiconductor device having a gate dielectric with a dipole layer and having a gate stressor layer, in accordance with an embodiment of the present disclosure.

In an example, FIG. 6A illustrates a cross-sectional view of a semiconductor device having a gate dielectric with a dipole layer and having a gate stressor, in accordance with an embodiment of the present disclosure.

Referring to FIG. 6A, an integrated circuit structure 600 includes a gate structure 602 above a substrate 604. In one embodiment, the gate structure 602 is above or over a semiconductor channel structure 606 including a monocrystalline material, such as monocrystalline silicon. The gate structure 602 includes a gate dielectric 602A over the semiconductor channel structure 606 and a gate electrode over the gate dielectric structure 602A. The gate dielectric 602A includes a high-k dielectric layer 602A2 on a dipole material layer 602A1, examples of which are described in association with FIGS. 2A and 2B. The gate electrode has a workfunction layer 602B on the high-k dielectric layer 602A2 of the gate dielectric 602A. A gate fill layer or layer(s) 602C is on or above the workfunction layer 602B. A source region 608 and a drain region 610 are on opposite sides of the gate structure 602. Source or drain contacts 612 are electrically connected to the source region 608 and the drain region 610 at locations 649, and are spaced apart of the gate structure 602 by one or both of an inter-layer dielectric layer 614 or gate dielectric spacers 616. In the example of FIG. 6A, the source region 608 and the drain region 610 are regions of the substrate 604. In an embodiment, the source or drain contacts 612 include a barrier layer 612A, and a conductive trench fill material 612B. In one embodiment, the gate dielectric 602A extends along the dielectric spacers 616, as is depicted in FIG. 6A. In an embodiment, the gate dielectric of gate stack 602 further includes an amorphous dielectric layer 603, such as a native, chemical, or thermally grown silicon oxide layer.

Figure 6B:
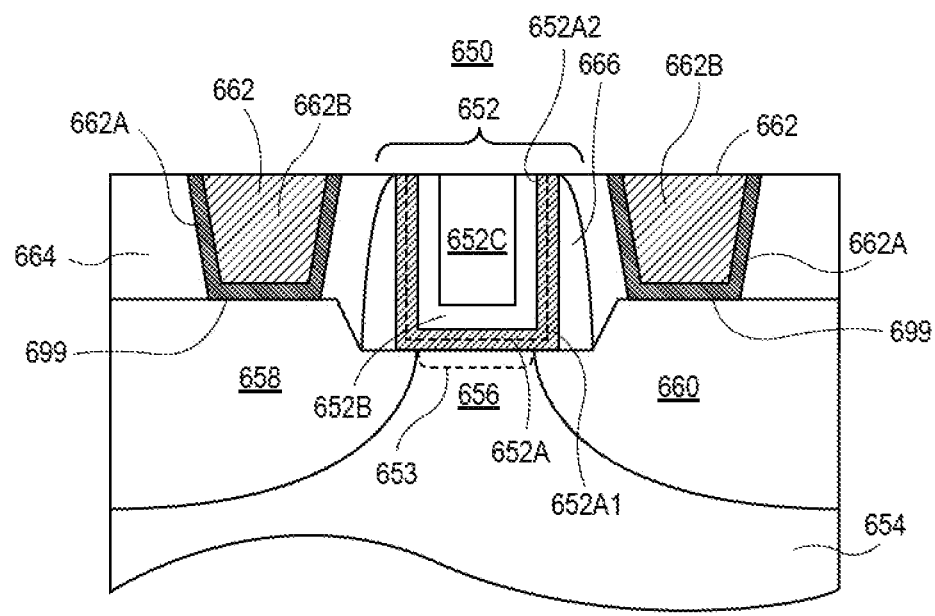
FIG. 6B illustrates a cross-sectional view of another semiconductor device having a gate dielectric with a dipole layer and having a gate stressor layer, in accordance with another embodiment of the present disclosure.

In another example, FIG. 6B illustrates a cross-sectional view of another semiconductor device having a gate dielectric with a dipole layer and having a gate stressor, in accordance with another embodiment of the present disclosure.

Referring to FIG. 6B, an integrated circuit structure 650 includes a gate structure 652 above a substrate 654. In one embodiment, the gate structure 652 is above or over a semiconductor channel structure 656 including a monocrystalline material, such as monocrystalline silicon. The gate structure 652 includes a gate dielectric 652A over the semiconductor channel structure 656 and a gate electrode over the gate dielectric structure. The gate dielectric 652A includes a high-k dielectric layer 652A2 on a dipole material layer 652A1, examples of which are described in association with FIGS. 2A and 2B, and may further include an amorphous oxide layer 653. The gate electrode has a workfunction layer 652B on the gate dielectric 652A. A gate fill layer or layer(s) 652C is on or above the workfunction layer 652B. A raised source region 658 and a raised drain region 660, such as regions of semiconductor material different than the semiconductor channel structure 656, are on opposite sides of the gate structure 652. Source or drain contacts 662 are electrically connected to the source region 658 and the drain region 660 at locations 699, and are spaced apart of the gate structure 652 by one or both of an inter-layer dielectric layer 664 or gate dielectric spacers 666. In an embodiment, the source or drain contacts 662 include a barrier layer 662A, and a conductive trench fill material 662B. In one embodiment, the gate dielectric 652A extends along the dielectric spacers 666, as is depicted in FIG. 6B.

Figure 7A:
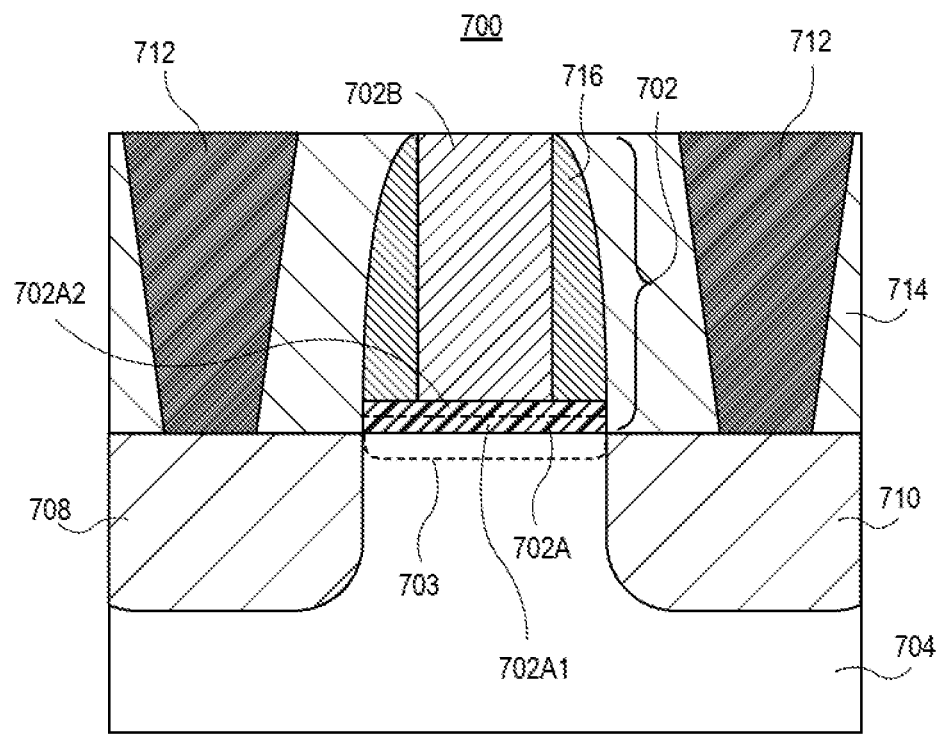
FIG. 7A illustrates a cross-sectional view of another semiconductor device having a gate dielectric with a dipole layer and having a gate stressor layer, in accordance with another embodiment of the present disclosure.

FIG. 7A illustrates a cross-sectional view of another semiconductor device having a gate dielectric with a dipole layer and having a gate stressor, in accordance with another embodiment of the present disclosure.

Referring to FIG. 7A, an integrated circuit structure 700 includes a gate structure 702 above a substrate 704. The gate structure 702 includes a gate dielectric 702A over a semiconductor channel structure and a gate electrode over the gate dielectric 702A. The gate dielectric 702A includes a high-k dielectric layer 702A2 on a dipole material layer 702A1 (examples of which are described in association with FIGS. 2A and 2B), and may further include an amorphous oxide layer 703. The gate electrode has a workfunction layer 702B on the gate dielectric 702A. The workfunction layer 702B can include a metal on the high-k dielectric layer 702A2. A source region 708 and a drain region 710 are on opposite sides of the gate structure 702. Source or drain contacts 712 are electrically connected to the source region 708 and the drain region 710, and are spaced apart from the gate structure 702 by one or both of an inter-layer dielectric layer 714 or gate dielectric spacers 716. In one embodiment, the gate dielectric 702A extends beneath the first and second dielectric spacers 716, as is depicted in FIG. 7A.

Figure 7B:
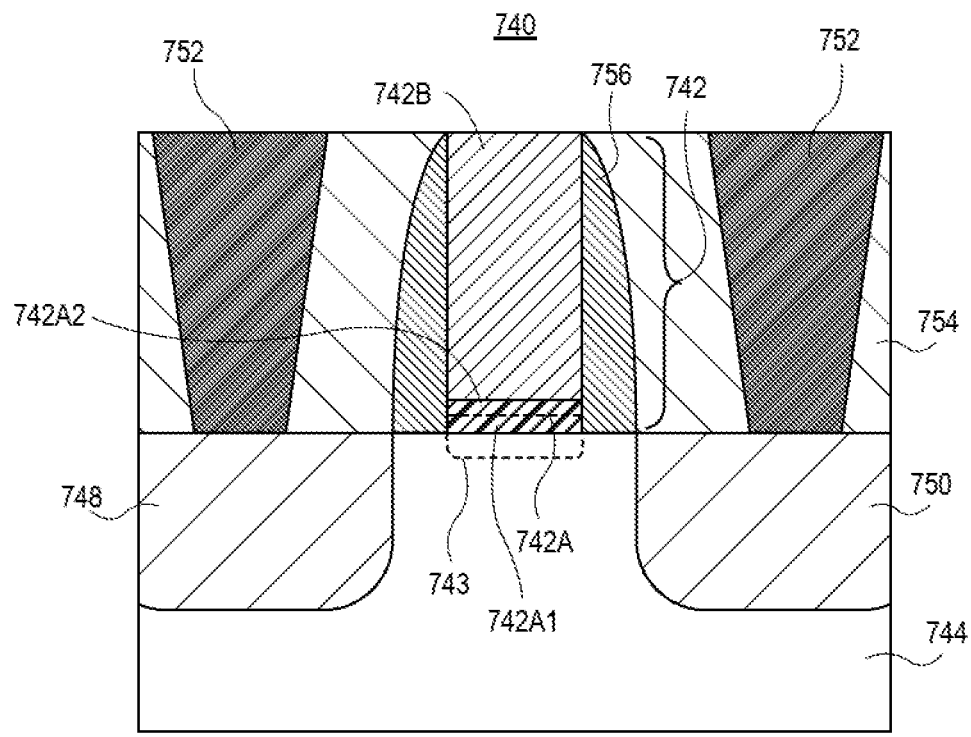
FIG. 7B illustrates a cross-sectional view of another semiconductor device having a gate dielectric with a dipole layer and having a gate stressor layer, in accordance with another embodiment of the present disclosure.

FIG. 7B illustrates a cross-sectional view of another semiconductor device having a gate dielectric with a dipole layer and having a gate stressor, in accordance with another embodiment of the present disclosure.

Referring to FIG. 7B, an integrated circuit structure 740 includes a gate structure 742 above a substrate 744. The gate structure 742 includes a gate dielectric 742A over a semiconductor channel structure and a gate electrode over the gate dielectric 742A. The gate dielectric 742A includes a high-k dielectric layer 742A2 on a dipole material layer 742A1 (examples of which are described in association with FIGS. 2A and 2B), and may further include an amorphous oxide layer 743. The gate electrode has a workfunction layer 742B on the gate dielectric 742A. A source region 748 and a drain region 750 are on opposite sides of the gate structure 742. Source or drain contacts 752 are electrically connected to the source region 748 and the drain region 750, and are spaced apart from the gate structure 742 by one or both of an inter-layer dielectric layer 754 or gate dielectric spacers 756. In one embodiment, the gate dielectric 742A is confined to a location the first and second dielectric spacers 716, as is depicted in FIG. 7B.

Figure 8:
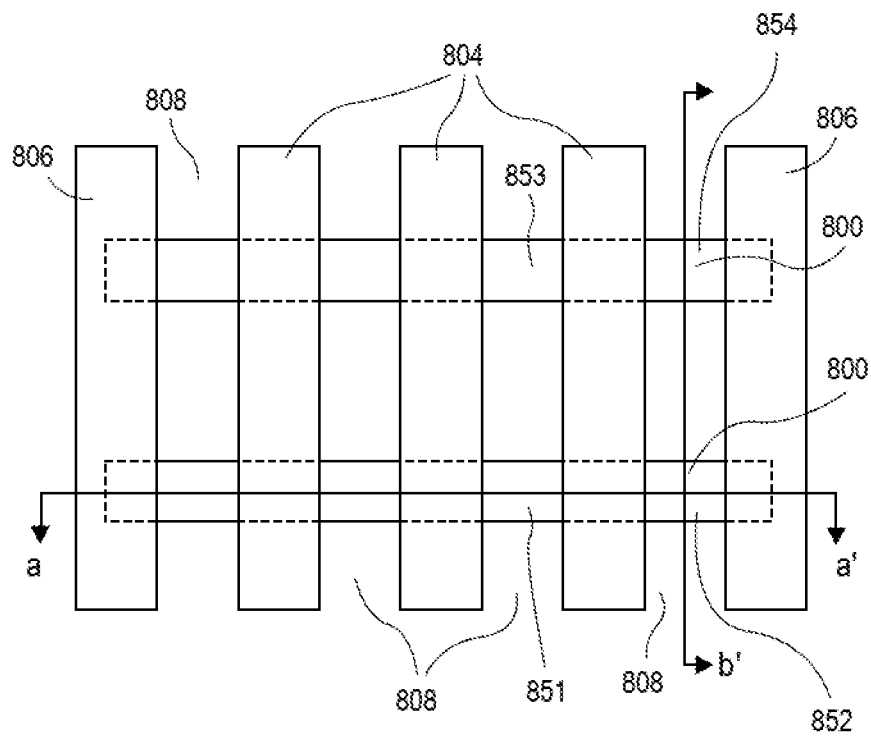
FIG. 8 illustrates a plan view of a plurality of gate lines over a pair of semiconductor fins, in accordance with an embodiment of the present disclosure.

FIG. 8 illustrates a plan view of a plurality of gate lines over a pair of semiconductor fins, in accordance with another embodiment of the present disclosure.

Referring to FIG. 8, a plurality of active gate lines 804 is formed over a plurality of semiconductor fins 800. Dummy gate lines 806 are at the ends of the plurality of semiconductor fins 800. Spacings 808 between the gate lines 804/806 are locations where trench contacts may be located to provide conductive contacts to source/drain regions, such as source/drain regions 851, 852, 853, and 854.

In an embodiment, the pattern of the plurality of gate lines 804/806 and/or the pattern of the plurality of semiconductor fins 800 is described as a grating structure. In an embodiment, the term "grating" for the plurality of gate lines 804/806 and/or the pattern of the plurality of semiconductor fins 800 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 804/806 and/or the pattern of the plurality of semiconductor fins 800 spaced at a constant pitch and having a constant width. The pattern may be fabricated by a pitch halving or pitch quartering, or other pitch division, approach.

Figure 9:
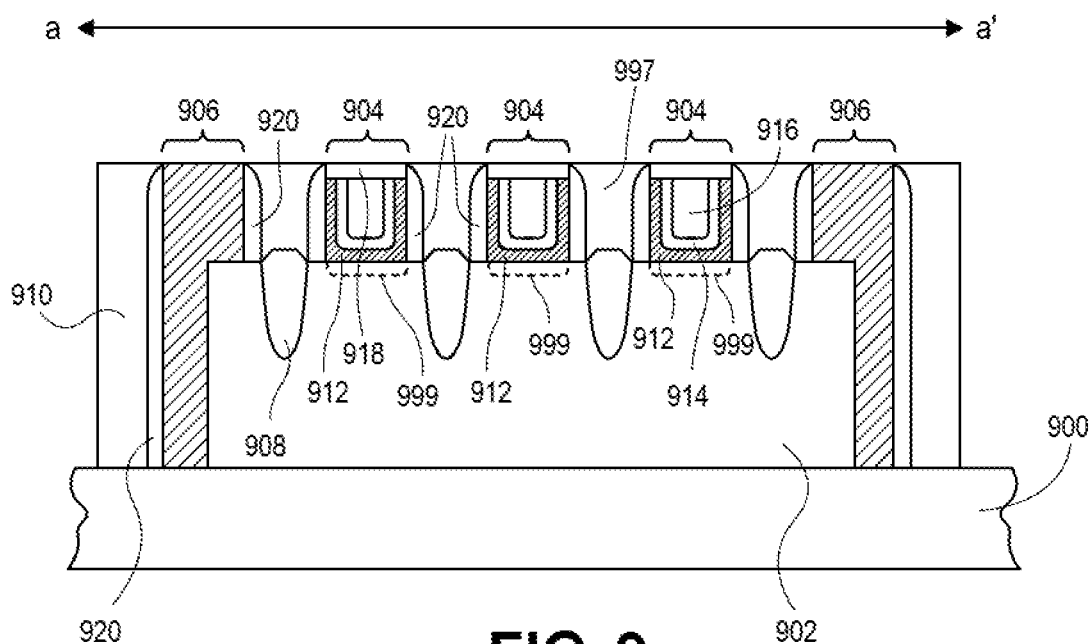
FIG. 9 illustrates a cross-sectional view, taken along the a-a' axis of FIG. 8, in accordance with an embodiment of the present disclosure.

FIG. 9 illustrates a cross-sectional view, taken along the a-a' axis of FIG. 8, in accordance with an embodiment of the present disclosure.

Referring to FIG. 9, a plurality of active gate lines 904 is formed over a semiconductor fin 902 formed above a substrate 900. Dummy gate lines 906 are at the ends of the semiconductor fin 902. A dielectric layer 910 is outside of the dummy gate lines 906. A trench contact material 997 is between the active gate lines 904, and between the dummy gate lines 906 and the active gate lines 904. Embedded source/drain structures 908 are in the semiconductor fin 902 between the active gate lines 904 and between the dummy gate lines 906 and the active gate lines 904.

The active gate lines 904 include a gate dielectric structure 912, a workfunction gate electrode portion 914 and a fill gate electrode portion 916, and a dielectric capping layer 918. Dielectric spacers 920 line the sidewalls of the active gate lines 904 and the dummy gate lines 906. In an embodiment, the gate dielectric structure 912 includes a high-k dielectric layer on a dipole material layer, examples of which are described in association with FIGS. 2A and 2B. In one embodiment, the gate dielectric structure 912 further includes an amorphous oxide layer 999.

Figure 10:
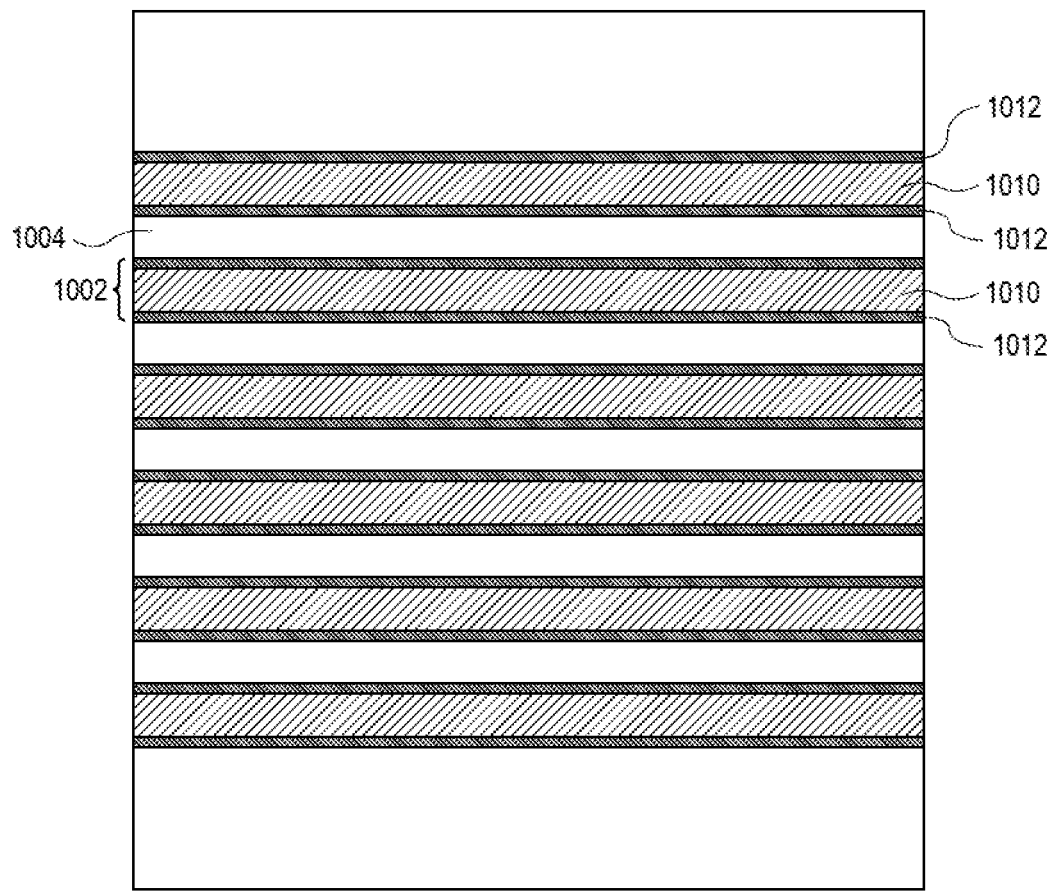
FIG. 10 illustrates a plan view and corresponding cross-sectional view of a metallization layer of an integrated circuit structure, in accordance with an embodiment of the present disclosure.
Figure 10:
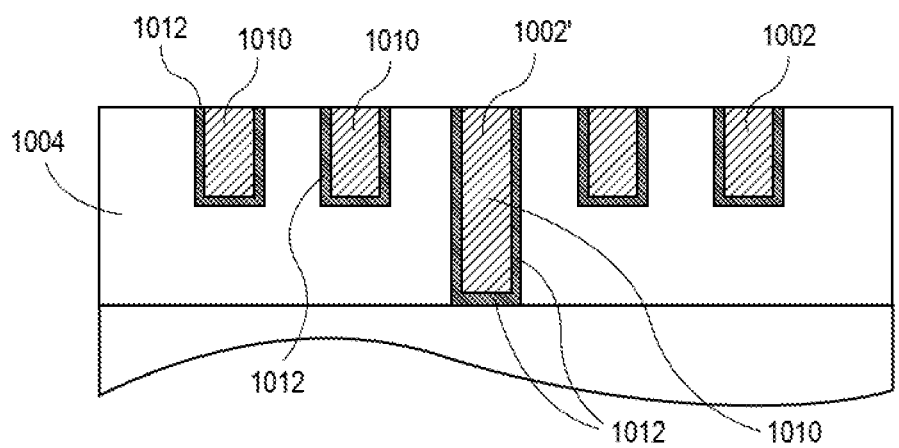

FIG. 10 illustrates a plan view and corresponding cross-sectional view of a metallization layer of an integrated circuit structure that may be fabricated above and may interconnect field effect transistors having a gate dielectric with a dipole layer and having a gate stressor, in accordance with an embodiment of the present disclosure.

Referring to FIG. 10, a metallization layer 1000 includes a pattern of conductive lines 1002 and interlayer dielectric (ILD) lines 1004. The metallization layer 1000 may be patterned in a grating-like pattern with conductive lines 1002 spaced at a constant pitch and having a constant width, as is depicted in FIG. 10. Although not shown, the conductive lines 1002 may have interruptions (i.e., cuts or plugs) at various locations along the lines. Some of the conductive lines may be associated with underlying vias, such as line 1002' shown as an example in the cross-sectional view.

In an embodiment, the term "grating" for conductive lines 1002 and ILD lines 1004 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 1002 and/or ILD lines 1004 spaced at a constant pitch and having a constant width. The pattern may be fabricated by a pitch halving or pitch quartering, or other pitch division, approach.

In an embodiment, the conductive lines 1002 (and, possibly, underlying via structures) are composed of one or more metal or other conductive structures. The conductive lines 1002 are also sometimes referred to in the art as traces, wires, lines, metal, interconnect lines or simply interconnects. In a particular embodiment, each of the conductive lines 1002 includes a barrier layer 1012 and a conductive fill material 1010. In an embodiment, the barrier layer 1012 is a titanium nitride or tantalum nitride barrier layer. In an embodiment, the conductive fill material 1010 is composed of a conductive material such as, but not limited to, Cu, Al, Ti, Zr, Hf, V, Ru, Co, Ni, Pd, Pt, W, Ag, Au or alloys thereof.

In an embodiment, ILD lines 1004 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 10 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 10 may be fabricated on underlying lower level back end of line (BEOL) interconnect layers.

Figure 11A:
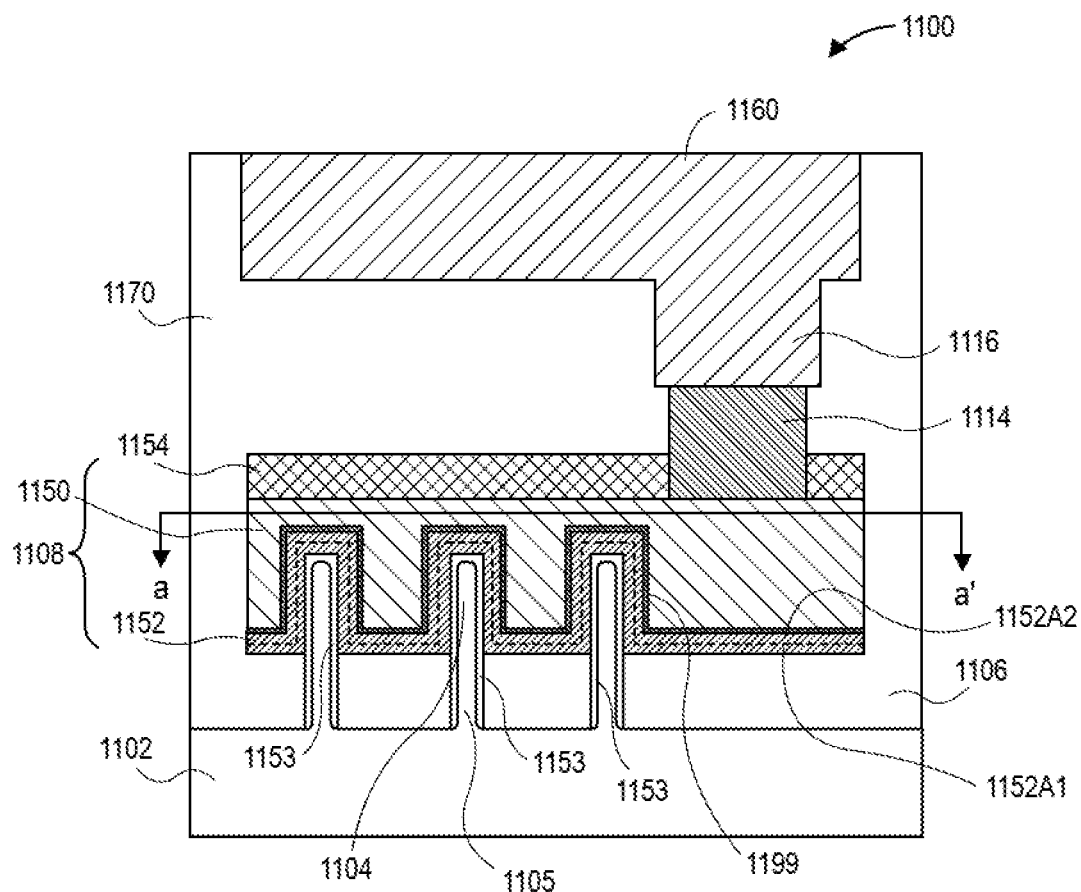
FIG. 11A illustrates a cross-sectional view of a non-planar semiconductor device having a gate dielectric with a dipole layer and having a gate stressor layer, in accordance with an embodiment of the present disclosure.
Figure 11B:
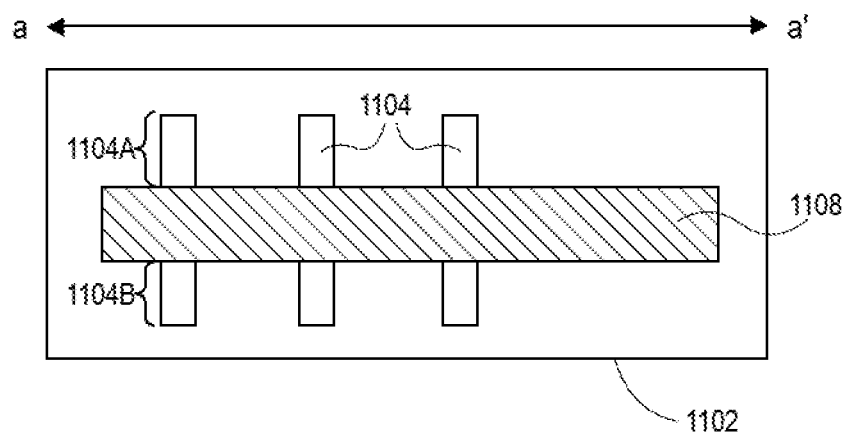
FIG. 11B illustrates a plan view taken along the a-a' axis of the semiconductor device of FIG. 11A, in accordance with an embodiment of the present disclosure.

One or more embodiments described herein are directed to fabricating semiconductor devices, such as for metal oxide semiconductor (MOS) device fabrication. As an example, FIG. 11A illustrates a cross-sectional view of a non-planar semiconductor device having a gate dielectric with a dipole layer and having a gate stressor, in accordance with an embodiment of the present disclosure. FIG. 11B illustrates a plan view taken along the a-a' axis of the semiconductor device of FIG. 11A, in accordance with an embodiment of the present disclosure.

Referring to FIG. 11A, a semiconductor structure or device 1100 includes a non-planar active region (e.g., a fin structure including protruding fin portion 1104 and sub-fin region 1105) formed from substrate 1102, and within isolation region 1106. A gate line 1108 is disposed over the protruding portions 1104 of the non-planar active region as well as over a portion of the isolation region 1106. As shown, gate line 1108 includes a gate electrode 1150/1199 and a gate dielectric structure 1152/1153. In one embodiment, gate line 1108 may also include a dielectric cap layer 1154. A gate contact 1114, and overlying gate contact via 1116 are also seen from this perspective, along with an overlying metal interconnect 1160, all of which are disposed in inter-layer dielectric stacks or layers 1170. Also seen from the perspective of FIG. 11A, the gate contact 1114 is, in one embodiment, disposed over isolation region 1106, but not over the non-planar active regions.

Referring to FIG. 11B, the gate line 1108 is shown as disposed over the protruding fin portions 1104. Source and drain regions 1104A and 1104B of the protruding fin portions 1104 can be seen from this perspective. In one embodiment, the source and drain regions 1104A and 1104B are doped portions of original material of the protruding fin portions 1104. In another embodiment, the material of the protruding fin portions 1104 is removed and replaced with another semiconductor material, e.g., by epitaxial deposition. In either case, the source and drain regions 1104A and 1104B may extend below the height of dielectric layer 1106, i.e., into the sub-fin region 1105.

In an embodiment, the semiconductor structure or device 1100 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 1108 surround at least a top surface and a pair of sidewalls of the three-dimensional body.

Substrate 1102 may be composed of a semiconductor material that can withstand a manufacturing process and in which charge can migrate. In an embodiment, substrate 1102 is a bulk substrate composed of a crystalline silicon, silicon/germanium or germanium layer doped with a charge carrier, such as but not limited to phosphorus, arsenic, antimony, boron, gallium or a combination thereof, to form active region 1104. In one embodiment, the concentration of silicon atoms in bulk substrate 1102 is greater than 97%. In another embodiment, bulk substrate 1102 is composed of an epitaxial layer grown atop a distinct crystalline substrate, e.g. a silicon epitaxial layer grown atop a boron-doped bulk silicon mono-crystalline substrate. Bulk substrate 1102 may alternatively be composed of a group III-V material. In an embodiment, bulk substrate 1102 is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 1102 is composed of a group III-V material and the charge-carrier dopant impurity atoms are ones such as, but not limited to, magnesium, beryllium, zinc, carbon, silicon, germanium, oxygen, sulfur, selenium or tellurium.

Isolation region 1106 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 1106 is composed of a dielectric material such as, but not limited to, silicon dioxide, silicon oxy-nitride, silicon nitride, or carbon-doped silicon nitride.

In an embodiment, the gate dielectric structure 1152/1153 includes a high-k dielectric layer 1152A2 on a dipole material layer 1152A1, examples of which are described in association with FIGS. 2A and 2B. In one embodiment, the gate dielectric structure further includes an amorphous oxide layer 1153. In some implementations, the portion 1152 of the gate dielectric structure may consist of a "U"-shaped structure that includes a bottom portion substantially parallel to the surface of the substrate and two sidewall portions that are substantially perpendicular to the top surface of the substrate.

In an embodiment, layer 1150 of the gate electrode 1150/1199 is composed of a non-workfunction-setting conductive fill material formed above a workfunction-setting layer 1199. In one such embodiment, the conductive fill material 1150 includes a gate stressor layer. A P-type metal layer can enable the formation of a PMOS gate electrode with a workfunction that is between about 4.9 eV and about 5.2 eV. An N-type metal layer can enable the formation of an NMOS gate electrode with a workfunction that is between about 3.9 eV and about 4.2 eV.

In some implementations, the workfunction-setting layer 1199 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 1154 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 1154 and/or dielectric spacers are composed of a dielectric material such as, but not limited to, silicon dioxide, silicon oxy-nitride, silicon nitride, or carbon-doped silicon nitride.

Gate contact 1114, overlying gate contact via 1116, and/or overlying metal interconnect 1160 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 1114, overlying gate contact via 1116, or overlying metal interconnect 1160 includes a barrier layer and a conductive fill material. In one such embodiment, the barrier layer is a tantalum nitride layer or a titanium nitride layer. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 1100 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 1108 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 1100. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 11A, the arrangement of semiconductor structure or device 1100 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 12:
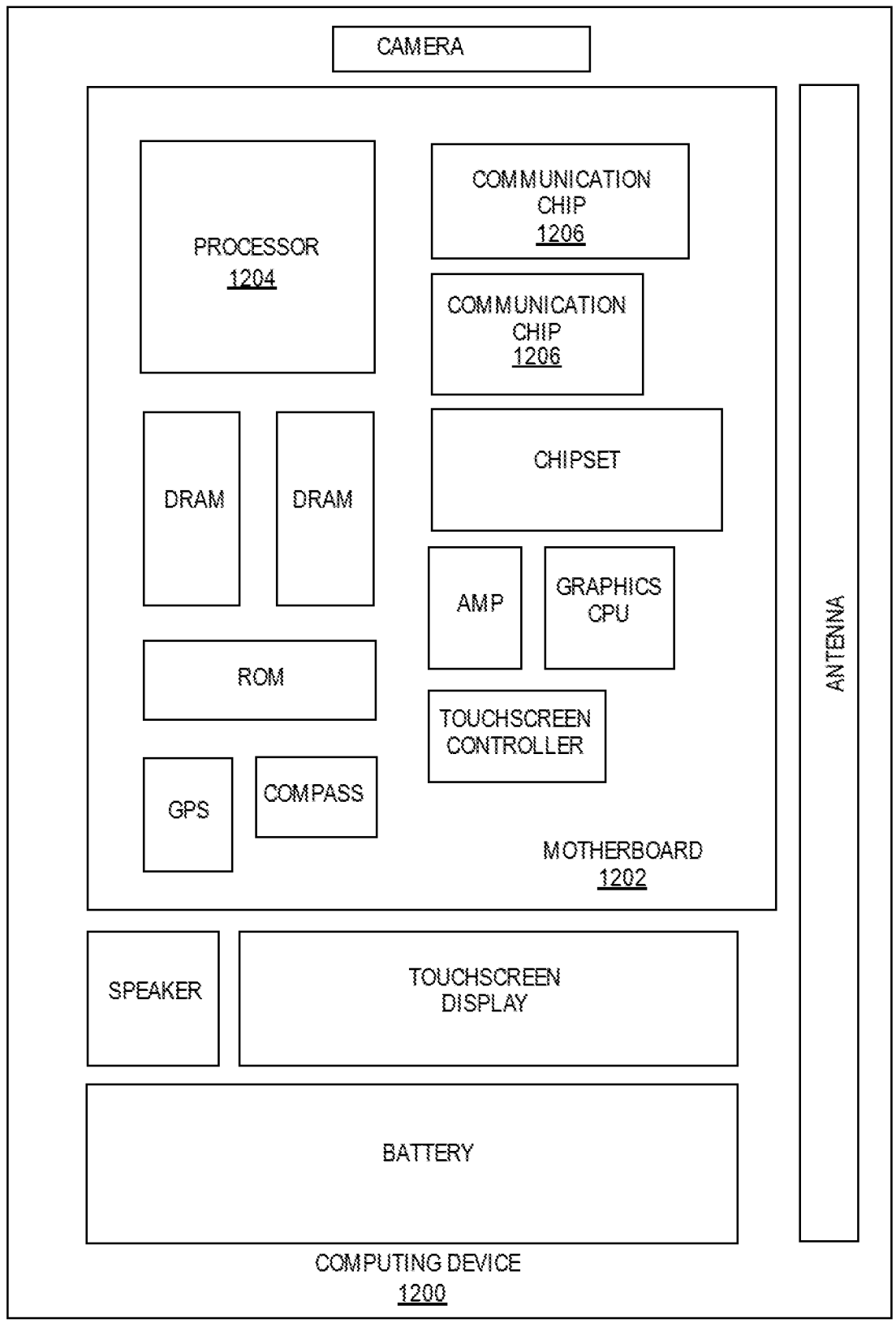
FIG. 12 illustrates a computing device in accordance with one implementation of an embodiment of the disclosure.

FIG. 12 illustrates a computing device 1200 in accordance with one implementation of the disclosure. The computing device 1200 houses a board 1202. The board 1202 may include a number of components, including but not limited to a processor 1204 and at least one communication chip 1206. The processor 1204 is physically and electrically coupled to the board 1202. In some implementations the at least one communication chip 1206 is also physically and electrically coupled to the board 1202. In further implementations, the communication chip 1206 is part of the processor 1204.

Depending on its applications, computing device 1200 may include other components that may or may not be physically and electrically coupled to the board 1202. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1206 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing device 1200 includes an integrated circuit die packaged within the processor 1204. In some implementations of the disclosure, the integrated circuit die of the processor includes one or more field effect transistors having a gate dielectric with a dipole layer and having a gate stressor, in accordance with implementations of embodiments of the disclosure. The term "processor" may refer to any device or portion of a device that processes electronic data from registers and/or memory to transform that electronic data into other electronic data that may be stored in registers and/or memory.

The communication chip 1206 also includes an integrated circuit die packaged within the communication chip 1206. In accordance with another implementation of embodiments of the disclosure, the integrated circuit die of the communication chip includes one or more field effect transistors having a gate dielectric with a dipole layer and having a gate stressor, in accordance with implementations of embodiments of the disclosure.

In further implementations, another component housed within the computing device 1200 may contain an integrated circuit die that includes one or more field effect transistors having a gate dielectric with a dipole layer and having a gate stressor, in accordance with implementations of embodiments of the disclosure.

In various implementations, the computing device 1200 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
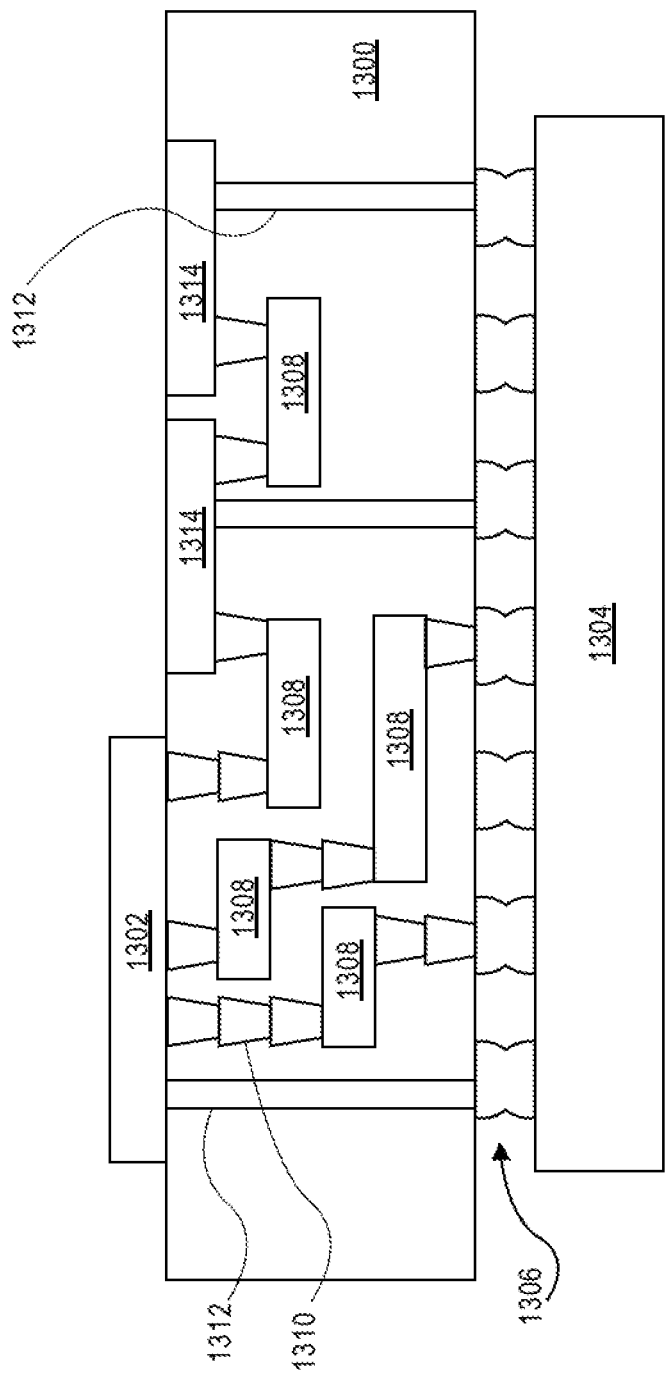
FIG. 13 is an interposer implementing one or more embodiments of the disclosure.

FIG. 13 illustrates an interposer 1300 that includes one or more embodiments of the disclosure. The interposer 1300 is an intervening substrate used to bridge a first substrate 1302 to a second substrate 1304. The first substrate 1302 may be, for instance, an integrated circuit die. The second substrate 1304 may be, for instance, a memory module, a computer motherboard, or another integrated circuit die. Generally, the purpose of an interposer 1300 is to spread a connection to a wider pitch or to reroute a connection to a different connection. For example, an interposer 1300 may couple an integrated circuit die to a ball grid array (BGA) 1306 that can subsequently be coupled to the second substrate 1304. In some embodiments, the first and second substrates 1302/1304 are attached to opposing sides of the interposer 1300. In other embodiments, the first and second substrates 1302/1304 are attached to the same side of the interposer 1300. And in further embodiments, three or more substrates are interconnected by way of the interposer 1300.

The interposer 1300 may be formed of an epoxy resin, a fiberglass-reinforced epoxy resin, a ceramic material, or a polymer material such as polyimide. In further implementations, the interposer 1300 may be formed of alternate rigid or flexible materials that may include the same materials described above for use in a semiconductor substrate, such as silicon, germanium, and other group III-V and group IV materials.

The interposer 1300 may include metal interconnects 1308 and vias 1310, including but not limited to through-silicon vias (TSVs) 1312. The interposer 1300 may further include embedded devices 1314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1300. In accordance with embodiments of the disclosure, apparatuses or processes disclosed herein may be used in the fabrication of interposer 1300.

Thus, embodiments described herein include field effect transistors having gate dielectrics with dipole layers and having gate stressor layers, and methods of fabricating field effect transistors having gate dielectrics with dipole layers and having gate stressor layers.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor channel structure including a monocrystalline material. A gate dielectric is over the semiconductor channel structure, the gate dielectric including a high-k dielectric layer on a dipole material layer, and the dipole material layer distinct from the high-k dielectric layer. A gate electrode has a workfunction layer on the high-k dielectric layer, the workfunction layer including a metal. A first source or drain structure is at a first side of the gate electrode. A second source or drain structure is at a second side of the gate electrode opposite the first side.

Example embodiment 2: The integrated circuit structure of example embodiment 1, wherein the high-k dielectric layer is an $HfO_2$ layer.

Example embodiment 3: The integrated circuit structure of example embodiment 1 or 2, wherein the gate electrode is an N-type gate electrode, and the dipole layer includes a material selected from the group consisting of $La_2O_3$, $Y_2O_3$, MgO, SrO and $Lu_2O_3$.

Example embodiment 4: The integrated circuit structure of example embodiment 1 or 2, wherein the gate electrode is a P-type gate electrode, and the dipole layer includes a material selected from the group consisting of $Al_2O_3$, $TiO_2$, $ZrO_2$ and $HfO_2$.

Example embodiment 5: The integrated circuit structure of example embodiment 1, 2, 3 or 4, wherein the dipole layer has a thickness in the range of 1-3 Angstroms.

Example embodiment 6: The integrated circuit structure of example embodiment 1, 2, 3, 4 or 5, the gate electrode further including a gate stressor layer on the workfunction layer.

Example embodiment 7: The integrated circuit structure of example embodiment 6, wherein the gate electrode is an N-type gate electrode, and the gate stressor layer includes a metal selected from the group consisting of W, Ti, Mn, Cr and Al.

Example embodiment 8: The integrated circuit structure of example embodiment 6, wherein the gate electrode is a P-type gate electrode, and the gate stressor layer includes a metal selected from the group consisting of Ti, Ta, Sn and Zr.

Example embodiment 9: The integrated circuit structure of example embodiment 1, 2, 3, 4, 5, 6, 7 or 8, wherein the gate dielectric further includes an amorphous oxide layer between the dipole material layer and the semiconductor channel structure.

Example embodiment 10: The integrated circuit structure of example embodiment 9, wherein the amorphous oxide layer is an $SiO_2$ layer.

Example embodiment 11: A method of fabricating an integrated circuit structure includes forming a high-k dielectric layer above a semiconductor channel structure. The method also includes forming a material layer on the high-k dielectric layer. The method also includes annealing the material layer and the high-k dielectric layer to form a gate dielectric over the semiconductor channel structure, the gate dielectric including the high-k dielectric layer on a dipole material layer, the dipole material layer distinct from the high-k dielectric layer. The method also includes, subsequent to annealing the material layer and the high-k dielectric layer, forming a workfunction layer on the high-k dielectric layer, the workfunction layer including a metal.

Example embodiment 12: The method of example embodiment 11, wherein the dipole layer has a thickness in the range of 1-3 Angstroms.

Example embodiment 13: The method of example embodiment 11 or 12, further including forming a gate stressor layer on the workfunction layer.

Example embodiment 14: A computing device includes a board and a component coupled to the board. The component includes an integrated circuit structure. The integrated circuit structure includes a semiconductor channel structure including a monocrystalline material. A gate dielectric is over the semiconductor channel structure, the gate dielectric including a high-k dielectric layer on a dipole material layer, and the dipole material layer distinct from the high-k dielectric layer. A gate electrode has a workfunction layer on the high-k dielectric layer, the workfunction layer including a metal. A first source or drain structure is at a first side of the gate electrode. A second source or drain structure is at a second side of the gate electrode opposite the first side.

Example embodiment 15: The computing device of example embodiment 14, further including a memory coupled to the board.

Example embodiment 16: The computing device of example embodiment 14 or 15, further including a communication chip coupled to the board.

Example embodiment 17: The computing device of example embodiment 14, 15 or 16, further including a camera coupled to the board.

Example embodiment 18: The computing device of example embodiment 14, 15, 16 or 17, further including a battery coupled to the board.

Example embodiment 19: The computing device of example embodiment 14, 15, 16, 17 or 18, further including an antenna coupled to the board.

Example embodiment 20: The computing device of example embodiment 14, 15, 16, 17, 18 or 19, wherein the component is a packaged integrated circuit die.

What is claimed is:

1. An integrated circuit structure, comprising:
a semiconductor channel structure comprising a monocrystalline material;
a gate dielectric over the semiconductor channel structure, the gate dielectric comprising a high-k dielectric layer on a dipole material layer, the dipole material layer distinct from the high-k dielectric layer, the dipole material layer comprising a material selected from the group consisting of $La_2O_3$, $Y_2O_3$, MgO, SrO, $Lu_2O_3$, $Al_2O_3$ and $TiO_2$, and the high-k dielectric layer comprising hafnium and oxygen, wherein the dipole material layer is a U-shaped dipole material layer, wherein the gate dielectric further comprises an amorphous oxide layer between the dipole material layer and the semiconductor channel structure, and wherein the dipole material layer is in direct contact with the amorphous oxide layer;
a gate electrode having a workfunction layer on the high-k dielectric layer, the workfunction layer comprising a metal, and the gate electrode comprising a conductive fill material on the workfunction layer, the conductive fill material having an uppermost surface co-planar with an uppermost surface of the U-shaped dipole material layer, wherein the conductive fill material comprises a gate layer on the workfunction layer, and wherein (i) the gate electrode is an N-type gate electrode and the gate layer comprises Cr chromium (Cr), or wherein (ii) the gate electrode is a P-type gate electrode and the gate layer comprises tin (Sn);
a first source or drain structure at a first side of the gate electrode; and
a second source or drain structure at a second side of the gate electrode opposite the first side.

2. The integrated circuit structure of claim 1, wherein the high-k dielectric layer is an $HfO_2$ layer.

3. The integrated circuit structure of claim 1, wherein the dipole layer has a thickness in the range of 1-3 Angstroms.

4. The integrated circuit structure of claim 1, wherein the gate electrode is the N-type gate electrode.

5. The integrated circuit structure of claim 1, wherein the gate electrode is the P-type gate electrode.

6. The integrated circuit structure of claim 1, wherein the amorphous oxide layer is an $SiO_2$ layer.

7. A computing device, comprising:
a board; and
a component coupled to the board, the component including an integrated circuit structure, comprising:
a semiconductor channel structure comprising a monocrystalline material;
a gate dielectric over the semiconductor channel structure, the gate dielectric comprising a high-k dielectric layer on a dipole material layer, the dipole material layer distinct from the high-k dielectric layer, the dipole material layer comprising a material selected from the group consisting of $La_2O_3$, $Y_2O_3$, MgO, SrO, $Lu_2O_3$, $Al_2O_3$ and $TiO_2$, and the high-k dielectric layer comprising hafnium and oxygen, wherein the dipole material layer is a U-shaped dipole material layer, wherein the gate dielectric further comprises an amorphous oxide layer between the dipole material layer and the semiconductor channel structure, and wherein the dipole material layer is in direct contact with the amorphous oxide layer;

a gate electrode having a workfunction layer on the high-k dielectric layer, the workfunction layer comprising a metal, and the gate electrode comprising a conductive fill material on the workfunction layer, the conductive fill material having an uppermost surface co-planar with an uppermost surface of the U-shaped dipole material layer, wherein the conductive fill material comprises a gate layer on the workfunction layer, and wherein (i) the gate electrode is an N-type gate electrode and the gate layer comprises chromium (Cr), or wherein (ii) the gate electrode is a P-type gate electrode and the gate layer comprises tin (Sn);

a first source or drain structure at a first side of the gate electrode; and a second source or drain structure at a second side of the gate electrode opposite the first side.

8. The computing device of claim 7, further comprising: a memory coupled to the board.

9. The computing device of claim 7, further comprising: a communication chip coupled to the board.

10. The computing device of claim 7, further comprising: a camera coupled to the board.

11. The computing device of claim 7, further comprising: a battery coupled to the board.

12. The computing device of claim 7, further comprising: an antenna coupled to the board.

13. The computing device of claim 7, wherein the component is a packaged integrated circuit die.

* * * * *